United States Patent
Matsunaga et al.

(10) Patent No.: US 7,023,015 B2
(45) Date of Patent: Apr. 4, 2006

(54) THIN-FILM SEMICONDUCTOR DEVICE AND LIQUID CRYSTAL DISPLAY

(75) Inventors: Naoki Matsunaga, Tokyo (JP); Kenji Sera, Tokyo (JP); Mitsuasa Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 46 days.

(21) Appl. No.: 10/638,398

(22) Filed: Aug. 12, 2003

(65) Prior Publication Data
US 2004/0063253 A1   Apr. 1, 2004

(30) Foreign Application Priority Data
Aug. 13, 2002 (JP) ............... 2002-235702

(51) Int. Cl.
*H01L 29/04*   (2006.01)
(52) U.S. Cl. ............ 257/59; 257/58; 257/64; 257/66; 438/163; 438/164; 438/165
(58) Field of Classification Search ............ 257/59, 257/64, 57–58, 65–66; 438/163–166
See application file for complete search history.

(56) References Cited

U.S. PATENT DOCUMENTS 6,835,607 B1 * 12/2004 Takemura et al. .......... 438/163

* cited by examiner

*Primary Examiner*—Dung A. Le
(74) *Attorney, Agent, or Firm*—Sughrue Mion, PLLC (57) ABSTRACT

A thin-film semiconductor device is provided including a plurality of thin-film transistors (TFT) having different driving voltages formed on an glass substrate, wherein a gate insulator electric field at each of the driving voltages of the plurality of thin-film transistors is in a range of about 1 MV/cm to 2 MV/cm, and a drain concentration of p-type thin-film transistors (TFT) is in a range of about $3E+19/cm^3$ to $1E+20/cm^3$.

9 Claims, 7 Drawing Sheets

THIN-FILM SEMICONDUCTOR DEVICE AND LIQUID CRYSTAL DISPLAY

BACKGROUND OF THE INVENTION

1. Field of the Invention

The present invention relates to a thin-film semiconductor device and a liquid crystal display (LCD), and more particularly, to a thin-film semiconductor device and LCD provided with a plurality of thin-film transistors (TFTs) having different driving voltages.

2. Description of the Related Art

An image display such as an LCD or an organic EL display is used as a monitor of a notebook-type personal computer or a portable terminal device such as a cellular phone or a mobile device. For example, in an active matrix-type LCD, TFT is formed of poly-crystalline silicon by arraying a matrix of picture elements on a glass substrate and the TFT is driven by a driver circuit such as an external gate driver or a data driver. Therefore, an active matrix-type LCD displays an image thereon by controlling a orientation of the liquid crystal.

Recently, along with downsizing of the portable terminal device, in an image display a method has been developed for forming a driver circuit, an amplifier circuit, etc. integrally on a glass substrate without mounting them externally thereto. In the case of the LCD in which the driver circuit is mounted integrally, these circuits are formed simultaneously with the TFTs that are formed in the picture elements as switching elements.

These switching TFTs and driver circuit are constituted of two types of TFTs, N-channel and P-channel ones. The TFTs are driven under various conditions, including high and low driving voltages. In the case of the driver circuit, for example, the driving voltage for a scanning line is different from that for a data line, and the breakdown voltage required for the respective TFTs is different depending upon the driving voltage. To improve performance of a relevant LCD, it is necessary to form TFTs to be suited for the various driving voltages at a high throughput.

Figure 1:
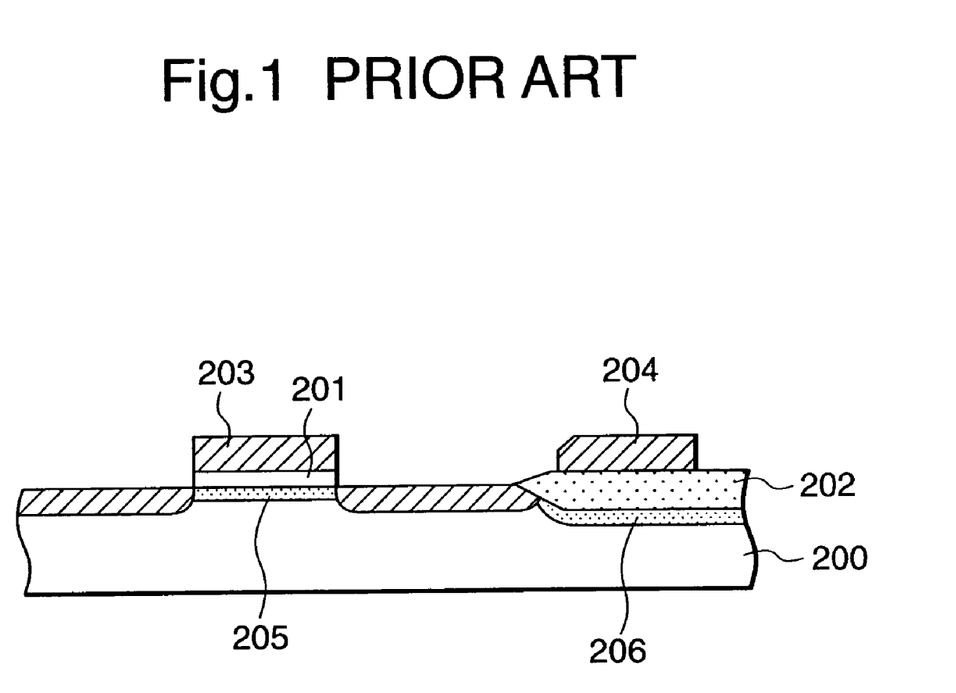
FIG. 1 is the cross-sectional view showing a conventional structure of a semiconductor.

For this purpose, there has been a method available to alter a thickness of a gate insulating film in order to adjust the breakdown voltage of the transistors. FIG. 1 shows a cross-sectional view of two types of transistors having different film thicknesses of the gate insulating films on a silicon substrate. As shown in FIG. 1, a thickness of a gate insulating film 201 between a gate electrode 203 and a channel-active layer 205 of the transistor is different from that of a gate insulating film 202 between a gate electrode 204 and a channel-active layer 206 of the other transistor. A thickness of the gate insulating film of the right-side transistor in FIG. 1 is formed larger than that of the left-side transistor, in order to accommodate a higher drain voltage taking into account gate and drain breakdown voltages of the transistor.

However, in order to form the TFTs as shown in FIG. 1, it is necessary to form each gate insulating film separately for transistors including p-type and n-type having different breakdown voltage, thereby resulting in a complicated process. Moreover, the transistor having a higher drain voltage, as shown on the right side of FIG. 1, needs to have a Lightly Doped Drain (LDD) structure containing a lightly-doped drain region, thereby further complicating the process.

SUMMARY OF THE INVENTION

An object of the present invention is to provide a thin-film semiconductor device and an LCD provided with high-voltage/low-voltage TFTs at a high throughput without complicating the process.

According to a first aspect of the present invention, a thin-film semiconductor device comprises a plurality of thin-film transistors (TFTs) having different driving voltages formed on an glass substrate, wherein a gate insulator electric field at each of the driving voltages of the plurality of thin-film transistors is in a range of about 1 MV/cm to 2 MV/cm, and a drain concentration of p-type thin-film transistors (TFT) is in a range of about $3E+19/cm^3$ to $1E+20/cm^3$. Here the drain concentration means atomic density as well as the carrier concentration for electric conductivity. Ordinarily impurities are doped in a range of atomic density and activated appropriately, such that the atomic density is substantially similar to the carrier concentration. However, even if the atomic density and the carrier concentration are not substantially similar, the range of the atomic density of about $3E+19/cm^3$ to $1E+20/cm^3$ can assist the effect of the present invention.

Thus, according to the present invention, it is possible to form simply a plurality of thin-film transistors (TFTs) having different driving voltages formed on an glass substrate by setting the range of the gate insulator electric field and drain concentration. The range of the gate insulator electric field may be in the range of 1 MV/cm to 2 MV/cm, and the range of the drain concentration of the P-type TFTs may be in the range of $3E+19/cm^3$ to $1E+20/cm^3$. In other words, it is possible to provide a plurality of TFTs in a greatly improved throughput, by regulating a gate insulator electric field and a drain concentration of P-type TFTs rather than by changing the gate insulating film for each type of TFTs.

According to a second aspect of the present invention, a thin-film semiconductor device comprising a thin-film semiconductor device comprising a plurality of thin-film transistors (TFTs) having a lower driving voltage and thin-film transistors having a higher driving voltage on an glass substrate, wherein all gate insulating films of the thin-film transistors are substantially the same film thickness and wherein a drain concentration of thin-film transistors (TFT) is in a range of about $3E+19/cm^3$ to $1E+20/cm^3$.

Thus, according to the present invention, it is possible to form a plurality of thin-film transistors (TFTs) having a lower driving voltage and thin-film transistors having a higher driving voltage on a glass substrate at a single gate insulating film by setting the range of drain concentration. The range of the drain concentration of the P-type TFTs may be in the range of $3E+19/cm^3$ to $1E+20/cm^3$. Therefore, it is possible to simplify the process of forming at least two types of TFTs having different driving voltages on an insulting glass substrate, thereby resulting in a greatly improved throughput.

According to a third aspect of the present invention, a thin-film semiconductor device manufacturing method comprises forming substantially the same thickness of gate insulating films of a plurality of thin-film transistors (TFTs) having different driving voltages formed on a glass substrate at one time. Thus, according to the present invention, it is possible to form a plurality of thin-film transistors (TFTs) having different driving voltage on an glass substrate at a single gate insulating film. Therefore, it results in a greatly improved throughput.

BRIEF DESCRIPTION OF THE DRAWINGS

FIGS. 6 (a) through (c) are cross-sectional views showing steps of a manufacturing method of the present invention.

DETAILED DESCRIPTION OF THE INVENTION

[First Embodiment]

Figure 2:
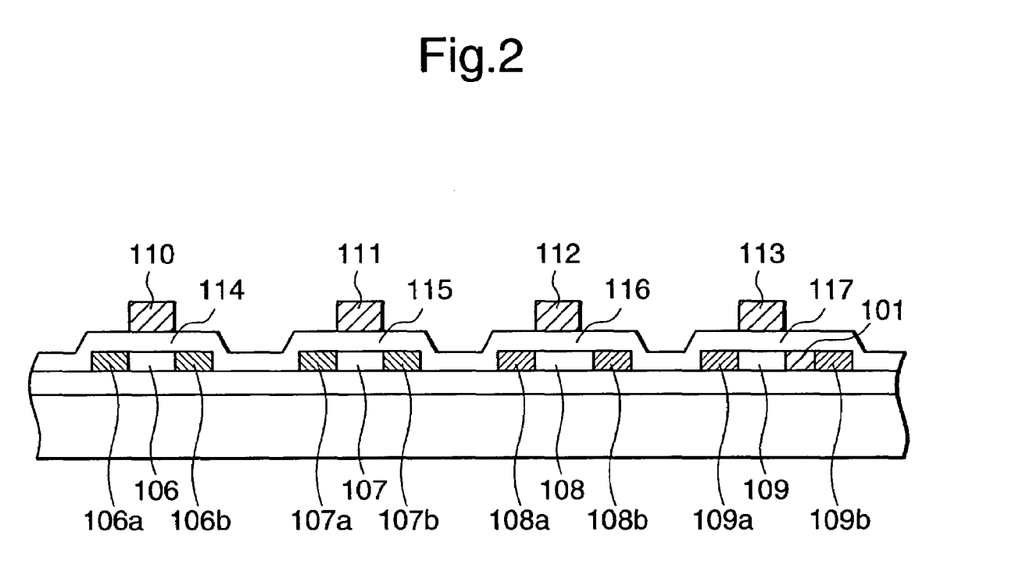
FIG. 2 is a cross-sectional view showing a structure of a thin-film semiconductor device related to a first embodiment of the present invention.
Figure 3A:
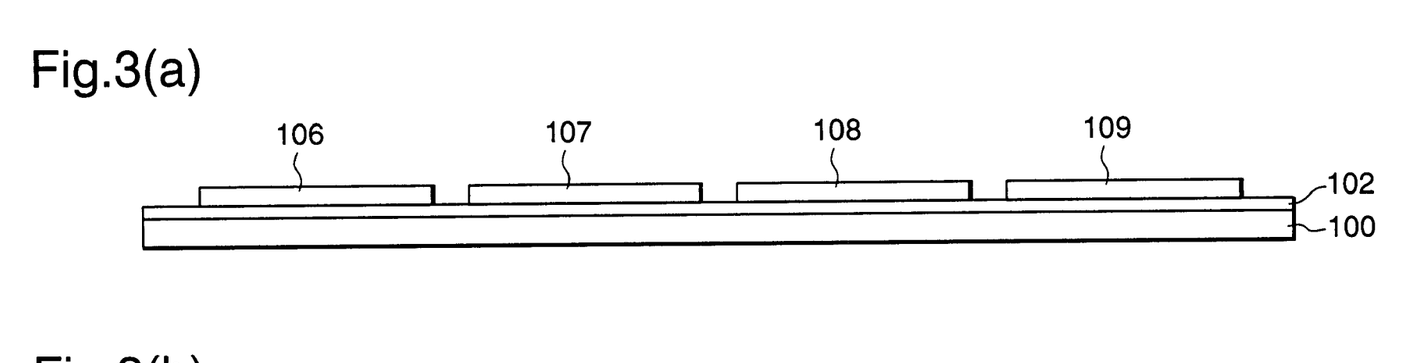
FIGS. 3(a) and (b) are cross-sectional views showing steps of a manufacturing method of the present invention.
Figure 3B:
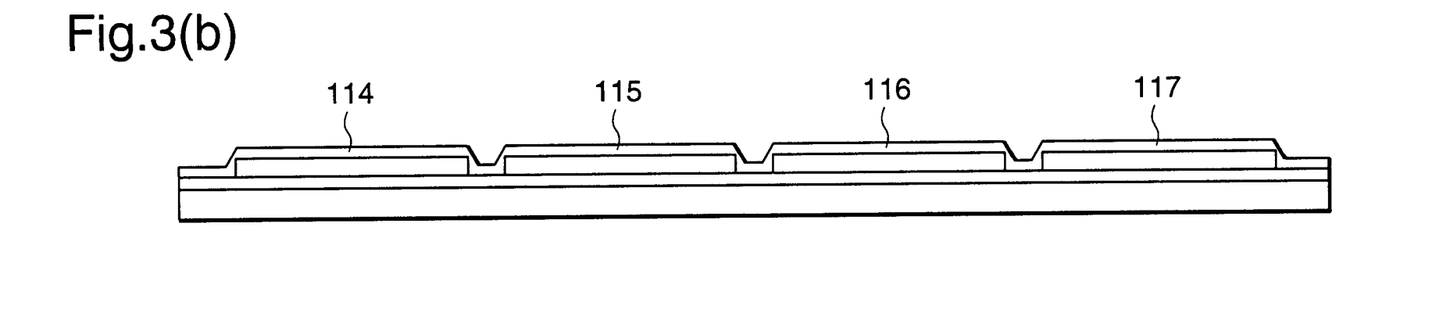

FIG. 2 shows a cross-sectional view showing a structure of a thin-film semiconductor device comprising a plurality of TFTs having different driving voltages related to a first illustrative embodiment of the present invention. FIG. 3 through FIG. 6 show cross-sectional view showing steps of a manufacturing method of the thin-film semiconductor device of the first embodiment in the present invention.

As shown in FIG. 2, an undercoat layer 102 is formed on a glass substrate 100, and amorphous or poly-crystalline silicon films 106–109 are formed on the undercoat layer. The gate insulating films 114–117 are provided on the amorphous or poly-crystal silicon films 106–109, and gate electrodes 110–113 are formed over the respective channel regions.

The glass substrate 100 may be on a transparent insulating substrate made of glass or plastic, a silicon oxide film (SiOx). The undercoat layer 102 is provided to prevent an impurity from being diffused from the glass substrate 100 into an active layer and so it is not necessary to form the undercoat layer if an influence of the impurity is negligible. The thickness of the insulating layer is set in that an electric field of a gate insulator at each of the driving voltages may be in a range of about 1 MV/cm to 2 MV/cm or any part thereof on the each silicon film 106–109 may be substantially same.

The regions 106a, 106b, 107a and 107b of the silicon films 106–109 are doped with a P-type dopant, while the regions 108a, 108b, 109a, 109b, and 101 thereof are doped with an N-type dopant. The drain concentration of p-type TFTs 106b and 107b are set in the range of 3E+19/cm$^3$ to 1E+20/cm$^3$ because if the drain concentration is larger than 1E+20/cm$^3$, a leakage current cannot be ignored. On the other hand, if it is not larger than 3E+19/cm$^3$, poor Ohmic contact occurs to give rise to parasitic resistance of the transistor and hence a bad characteristic. Thus, by setting the range of the drain concentration of p-type TFTs properly, TFTs of four different types (low-voltage P-type, high-voltage P-type, low-voltage N-type, and high-voltage N-type TFTs) can be formed on a glass substrate with a gate insulating film thickness.

The reference numeral 101 indicates a lightly-doped region that serves to reserve a drain breakdown voltage of the high-voltage N-type TFTs. This structure is referred as lightly doped drain (LDD) structure. The N-type TFTs employ the LDD structure for their operation at a high voltages to thus reserve a sufficient breakdown voltage even at a high voltages, so that resultantly they can use a gate insulating film set in the range of 1 MV/cm to 2 MV/cm or having the same film thickness as that for the P-type TFTs.

The thin-film semiconductor device having such a configuration can be manufactured by the following method. First, on a glass substrate 100 a silicon nitride film (SiNx), for example, is formed by Low-Pressure Chemical Vapor Deposition (LPCVD), Plasma-Enhanced CVD (PCVD), sputtering, etc. as an undercoat layer 102.

Next, amorphous silicon (hereinafter abbreviated as a-Si) film is formed by LPCVD, PCVD, sputtering, etc. as an active layer. On the a-Si film, a resist pattern is formed by a photolithographic process to perform channel doping by ion injection or ion doping. The a-Si film is annealed using an excimer laser beam (ELA) and crystallized in order to form a polycrystal silicon film. Then, the island-patterned silicon films 106–109 are formed by photolithographic process (FIG. 3(a)).

Next, silicon oxide films are formed as the gate insulating films 114–117 by LPCVD, PCVD, sputtering, etc. In the conventional method, the gate insulating films must be partially formed and etched in a process because the film thicknesses of the gate insulating films need to be altered in accordance with the driving voltages of the TFTs. On the other hand, by the method of the present invention the gate insulating films 114–117 can be formed in the same process because it is possible to regulate the electric field of the gate insulator and the drain concentration of the P-type TFTs (FIG. 3(b)).

Figure 4A:
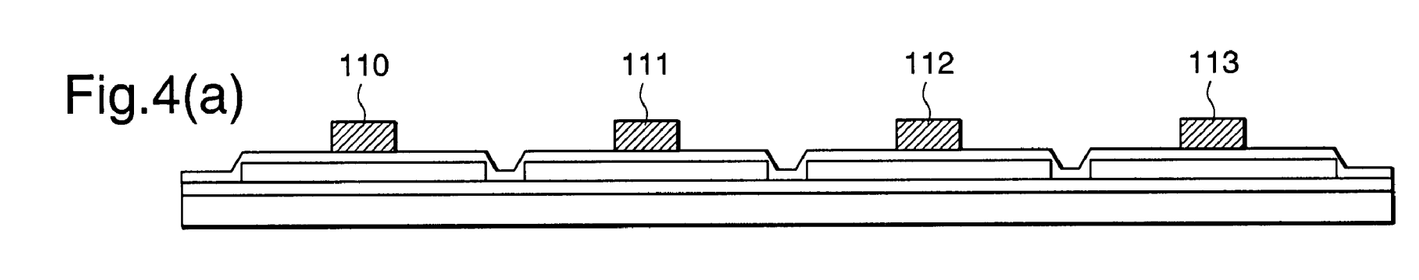
FIGS. 4(a) through (c) are cross-sectional views showing steps of a manufacturing method of the present invention.

Then, a material containing an N-type impurity is deposited by PCVD, sputtering, etc. and patterned by a photolithographic process to form the gate electrodes 110–113 (FIG. 4(a)). The gate electrode material may be poly-silicon, aluminum, chromium, tungsten silicide, chromium, molybdenum, copper, titanium, tantalum, etc.

Figure 4B:
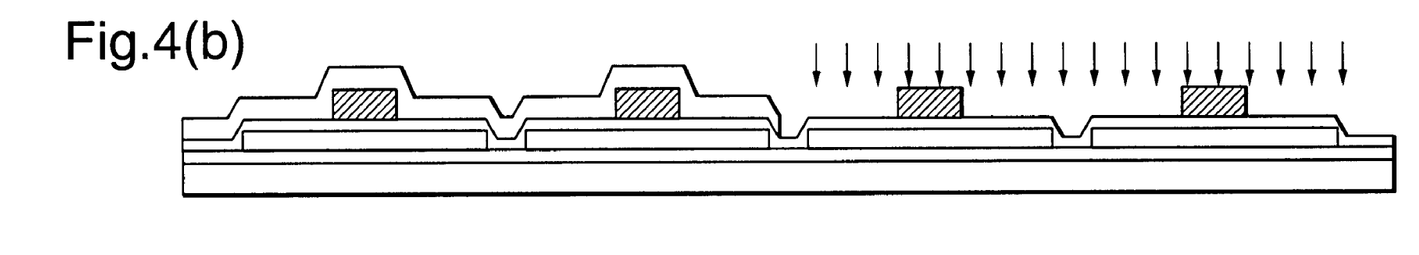
Figure 4C:
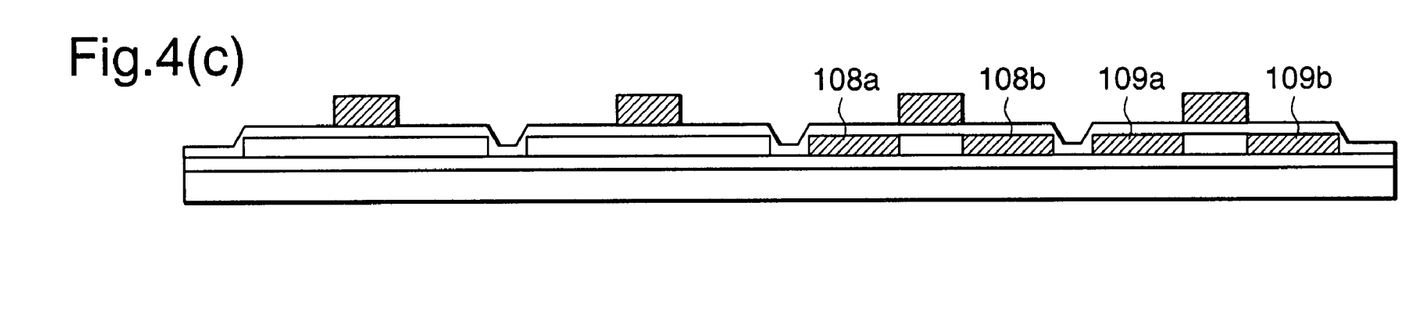
Figure 5A:
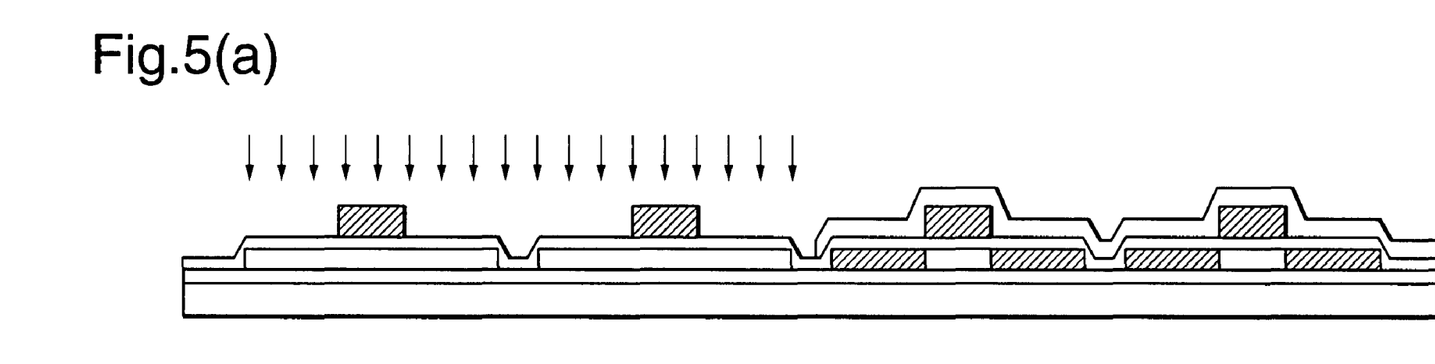
FIGS. 5(a) and (b) are cross-sectional views showing steps of a manufacturing method of the present invention.
Figure 5B:
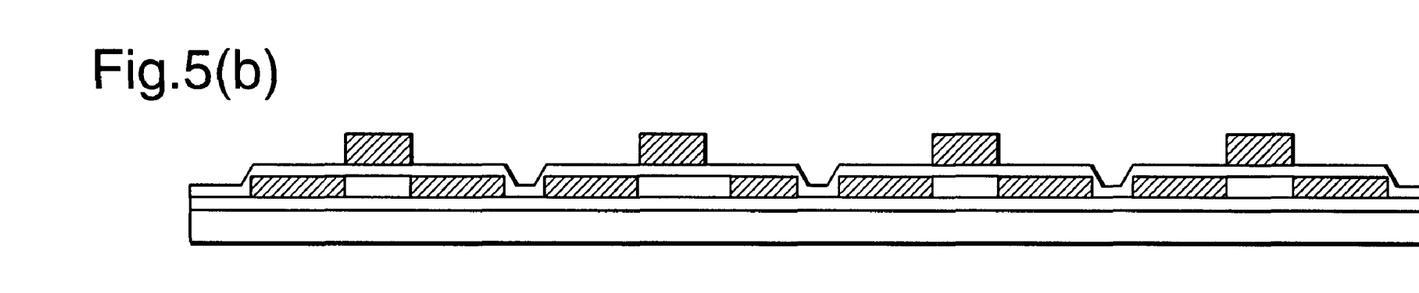

Next, regions in which the P-type TFTs are to be formed are covered by a resist pattern and phosphorus (P) is doped into the N-type TFTs using the gate electrodes 112 and 113 as a mask (FIG. 4(b)). The regions 108a, 108b, 109a, and 109b are formed. Subsequently, regions in which the N-type TFTs are to be formed are covered by a resist pattern and boron (B) is doped similarly into the P-type TFTs using the gate electrodes 110 and 111 as a mask (FIG. 5(a)). Thereby source/drain regions 106a, 106b, 107a, and 107b are formed (FIG. 5(b)). In this case, the drain concentration of the P-type TFTs is set in a range of 3E+19/cm$^3$ to 1E+20/cm$^3$ as described above. It is to be noted that doping may be performed on the N-type TFTs and the P-type TFTs in this order or a reversed order arbitrarily.

Figures 6A, 6B:
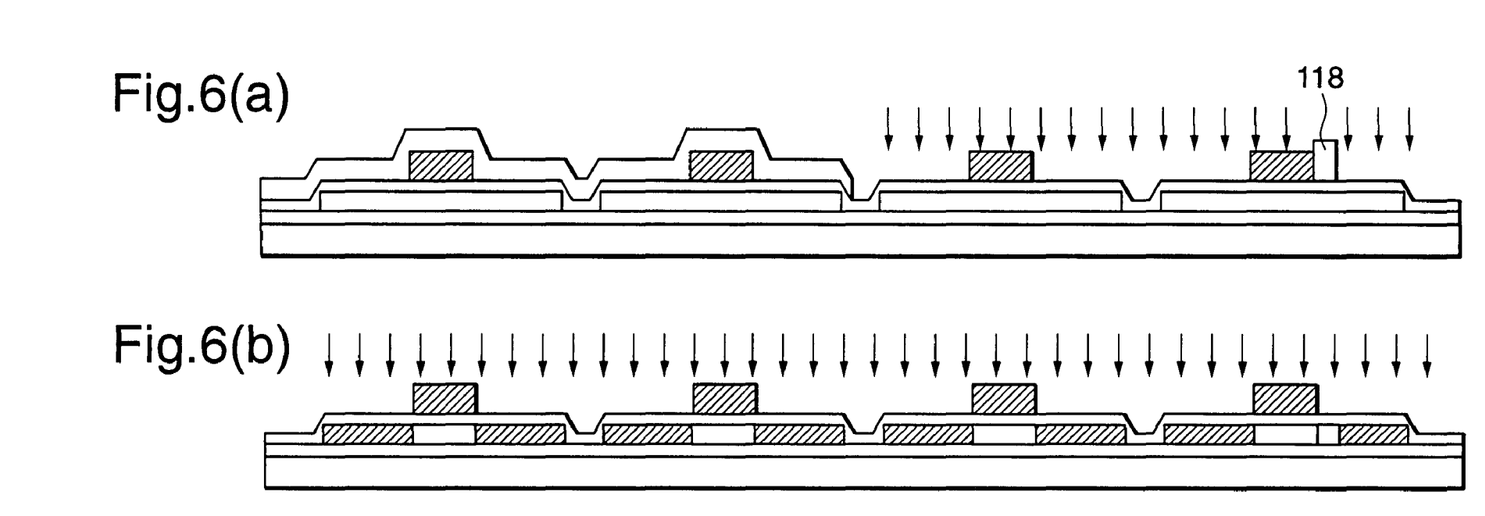
Figure 6C:
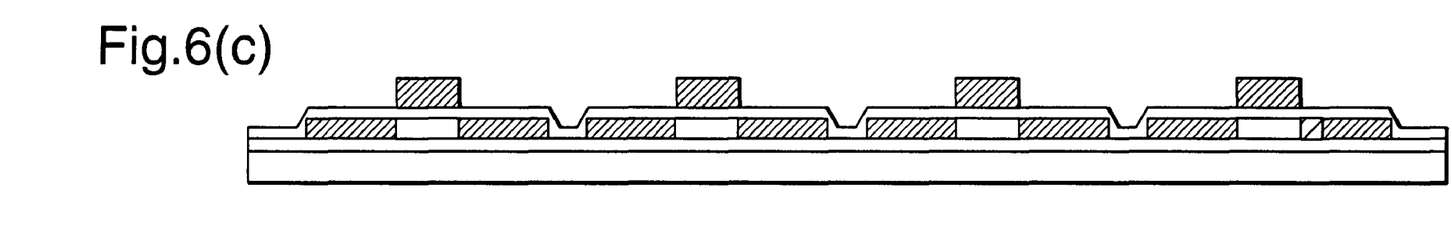

Then, in the case of forming the LDD structure to increase the reliability of the device in a high electric field region in the neighborhood of the drain, as shown in FIG. 6(a) through (c), P is injected at a low concentration using the gate electrode 113 as the mask after the impurity is injected with the gate as offset using the resist pattern 118. Then, the lightly-doped region 101 is formed by thermal activation, laser activation by use of a laser beam, Rapid Thermal Annealing (RTA) by use of a lamp or hot N$_2$, etc.

Subsequently, after hydrogen plasma processing is performed, a silicon oxide film, silicon nitride film, etc. are deposited as an inter-layer insulation film. Next, a contact hole is formed in the gates and the sources/drains and metal is deposited to form the electrodes and wire. Then, a silicon nitride film, for example, is formed as a passivation film and a pad contact hole is formed therein. Thus the TFT device is manufactured.

In contrast to the conventional structure, in the present embodiment, it is possible to form TFTs having a different breakdown voltage by regulating a film thickness and a drain concentration of the P-type TFTs.

Furthermore, in the conventional structure it is necessary to form the gate insulating films of the high-voltage and low-voltage TFTs in different film thicknesses and, therefore, to perform gate insulating film formation twice and etching once. However, in the present invention these complicated steps can be avoided, enabling to be formed the TFTs having different driving voltages by using the same gate insulating film, thereby resulting in simplification of the manufacturing process.

Furthermore, by employing the LDD structure at least on the high-voltage N-type TFTs, it is possible to form the N-type TFTs by using the same gate insulating film as that of the P-type TFTs, thereby simplifying the manufacturing process and improving throughput.

By manufacturing an image display such as an LCD or an organic EL display by using the substrate on which TFTs having different breakdown voltages are formed, it is possible to set operations of circuits optimally, thereby improving performance of the image display.

The gate electrodes 110, 111, 112, and 113 of FIG. 2 can be formed of a material containing an N-type impurity or a P-type impurity.

Further, while the present invention describes a low-concentration impurity region 101 provided in the drains of the high-voltage N-type TFTs, the low-concentration impurity region 101 may also be provided also in the source regions. Even in such a case, no additional step is required, thereby avoiding preventing an improvement in throughput.

[Second Embodiment]

Figure 7:
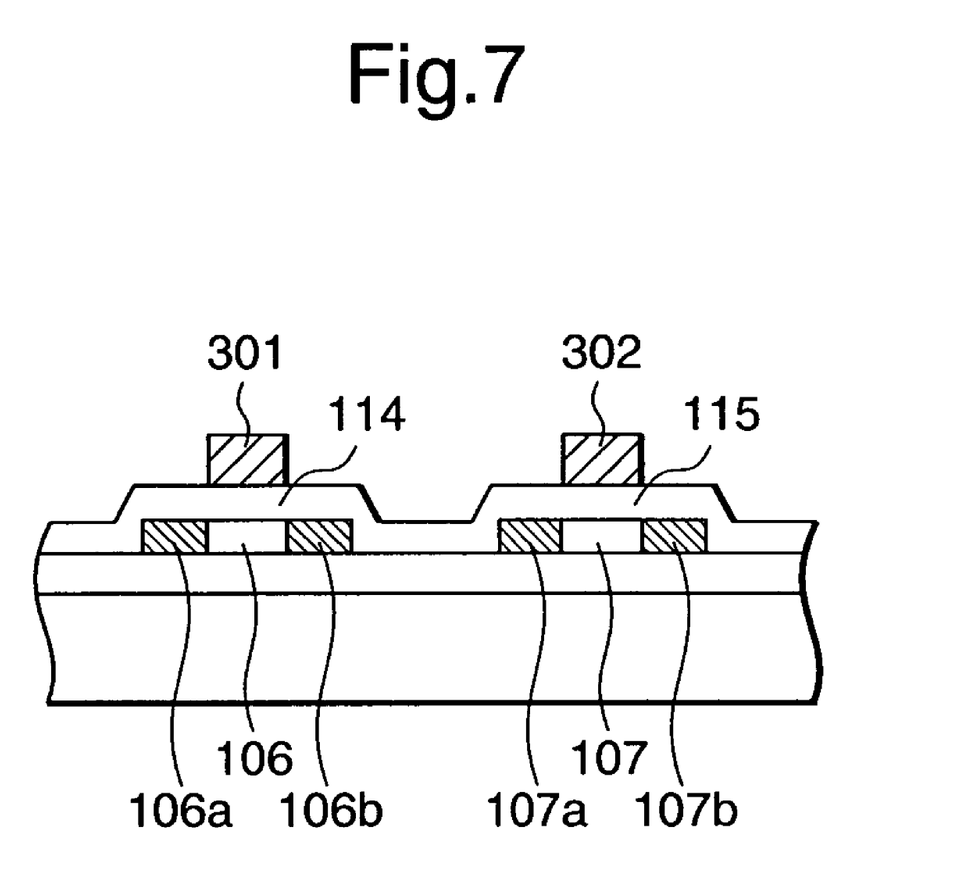
FIG. 7 is a cross-sectional view showing a structure of a thin-film semiconductor device related to a second embodiment of the present invention.

FIG. 7 shows a cross-sectional view of a thin-film semiconductor device related to a second illustrative embodiment of the present invention.

The second embodiment is different from the first embodiment in that the electric field of the gate insulator is regulated to a range of 0.2 MV/cm to 0.8 MV/cm. By reducing the upper limit to 1 MV/cm or less, it is possible to manufacture the high-voltage and the low-voltage N-type and P-type transistors by self-alignment with a gate insulating film without providing the region 101 additionally. Such a structure makes it possible to further eliminate a step required to provide the light-doped region 101, thereby simplifying the manufacturing process further.

What is claimed is:

1. A thin-film semiconductor device comprising:
a first plurality of thin-film transistors having different driving voltages than a second plurality of thin-film transistors, wherein said first and second plurality of transistors are formed on a glass substrate,
wherein an electric field of a gate insulated at each of said driving voltages of said first and second plurality of thin-film transistors is in a range of about 1 MV/cm to 2 MV/cm, and a drain concentration of P-type thin-film transistors is in a range of about $3E+19/cm^3$ to $1E+20/cm^3$.

2. The thin-film semiconductor device according to claim 1,
wherein said first plurality of thin-film transistors comprising N-type and P-type thin-film transistors have a lower driving voltage than said second plurality of thin-film transistors comprising N-type and P-type thin film transistor.

3. The thin-film semiconductor device according to claim 2,
wherein at least one N-type thin-film transistor of said second plurality of thin-film transistors have a lightly-doped drain structure.

4. The thin-film semiconductor device according to claim 1,
wherein a plurality of gate insulating films of said first and second plurality of thin-film transistors have substantially the same thickness.

5. A liquid crystal display comprising:
a thin-film semiconductor device according to claim 1; and
a driver circuit.

6. A thin-film semiconductor device comprising:
a first plurality of thin-film transistors having different driving voltages than a second plurality of thin-film transistors, wherein said first and second plurality of transistors are formed on a glass substrate,
wherein an electric field of a gate insulator at each of said driving voltages of said first and second plurality of thin-film transistors is in a range of about 0.2 MV/cm to 0.8 MV/cm, and a drain concentration of P-type thin-film transistors is in a range of about $3E+19/cm^3$ to $1E+20/cm^3$.

7. The thin-film semiconductor device according to claim 6,
wherein said first and second plurality of thin-film transistors comprising N-type and P-type thin-film transistors have a lower driving voltage than said second plurality of thin-film transistors comprising N-type and P-type thin film transistor.

8. The thin-film semiconductor device according to claim 6,
wherein a plurality of gate insulating films of said first and second plurality of thin-film transistors has substantially the same thickness.

9. The thin-film semiconductor device according to claim 7,
wherein at least one N-type thin-film transistor of said second plurality of thin-film transistors have a lightly-doped drain structure.

* * * * *